United States Patent [19]
May

[11] 3,774,232
[45] Nov. 20, 1973

[54] PACKAGE FOR INTEGRATED CIRCUIT CHIP

[75] Inventor: Donald L. May, Manhattan Beach, Calif.

[73] Assignee: Circuit-Stik, Inc., Gardena, Calif.

[22] Filed: Nov. 11, 1971

[21] Appl. No.: 197,888

[52] U.S. Cl. ............ 174/52 S, 29/625, 174/DIG. 3, 317/101 CP, 317/101 CC

[51] Int. Cl. .............................................. H05k 5/00

[58] Field of Search...................... 174/DIG. 3, 52 S, 174/52 PE; 317/101 CP, 101 CC, 234 E, 234 F, 234 G, 234 N; 29/626, 627

[56] References Cited

UNITED STATES PATENTS

| | | | |
|---|---|---|---|
| 3,289,046 | 11/1966 | Carr | 317/101 A |
| 3,319,319 | 5/1967 | Oswald | 174/68.5 UX |
| 3,501,833 | 3/1970 | Spiegler | 174/DIG. 3 U |

OTHER PUBLICATIONS

Green "Printed Circuit Packaging" IBM Tech. Disc. Bulletin, Vol. 3, No. 12 5/1961

*Primary Examiner*—Darrell L. Clay
*Attorney*—Jessup & Beecher

[57] ABSTRACT

An improved microcircuit package is provided for integrated circuit chips, or the like, and which greatly simplifies the manner in which electrical connections may be made between the contacts on the chip and the terminal electrodes and other connections of the microcircuit. The package of the invention comprises a substrate of glass ceramic, polymide, or the like, having adhesive electric conductors formed on its surface, which conductors make connection between the contacts on the integrated circuit chip and the terminal electrodes, merely by pressing the chip over the adhesive electric conductors, the conductors serving additionally to hold and position the chip in the flat pack.

3 Claims, 7 Drawing Figures

PATENTED NOV 20 1973 3,774,232

SHEET 1 OF 2

INVENTOR:
Donald L. May
Jessup and Beecher
By Keith D. Beecher
ATTORNEYS

INVENTOR:
Donald L. May
Jessup and Beecher
By Keith D. Beecher
ATTORNEYS

PACKAGE FOR INTEGRATED CIRCUIT CHIP

BACKGROUND OF THE INVENTION

It is well established, in the packaging of integrated circuit chips, for the chip to be supported on an insulating ceramic base, which is held in a lead frame, and for an hermetically sealed enclosure for the chip to be provided over the base. It is also usual in the prior art to form a plurality of electrical leads on the base which serve as terminal connections for the chip. In the prior art practice, the chip is first mounted on the base, and the electric conductors on the frame are connected to the contacts on the chip by difficult and sensitive manual operations which usually involve welding or soldering fine whisker wires to the chip contacts and to the electrical leads. The painstaking manual operations required to formulate the prior art integrated circuit chip flat packs has caused the resulting assembly to be relatively high in price.

With the structure of the present invention, the electrical conductors on the base of the microcircuit package are formed of a conductive, adhesive material, so that the chip may simply be pressed over the base conductors; with the conductors making the electrical contact between the contacts of the chip, and the terminal electrodes, and with the base conductors also serving to support the chip in proper position on the base. Thus, in the practice of the present invention, the difficult, tedious and timeconsuming operations of the prior art, by which the chip is first mounted on the base and by which whisker wires are manually welded or otherwise attached to the chip and to the electrical leads, is replaced by a simple operation, which may easily be automated, and by which the chips are merely pressed down over the adhesive leads in a single operation.

DETAILED DESCRIPTION OF THE ILLUSTRATED EMBODIMENTS

The package itself in the example under consideration may be similar to the microcircuit package described in U.S. Pat. No. 3,501,833 which issued Mar. 24, 1970 in the name of John Spiegler. It will be understood, of course, that such a package is described herein merely as an example of a typical package to which the concepts of the present invention may be applied.

Figure 1:
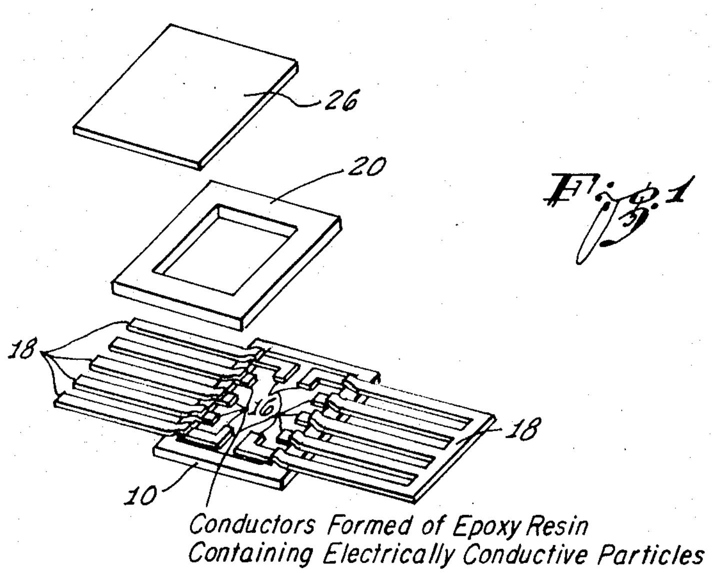
FIG. 1 is an exploded perspective view of an electronic device which may incorporate the concepts of the invention.
Figure 2:
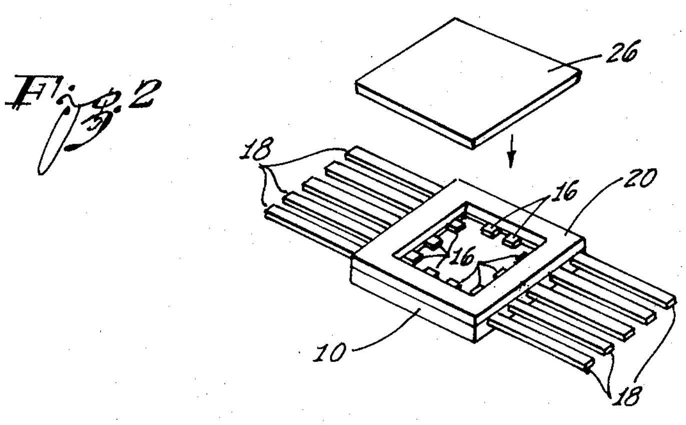
FIG. 2 is a perspective view of the device of FIG. 1 in an assembled condition.
Figure 3:
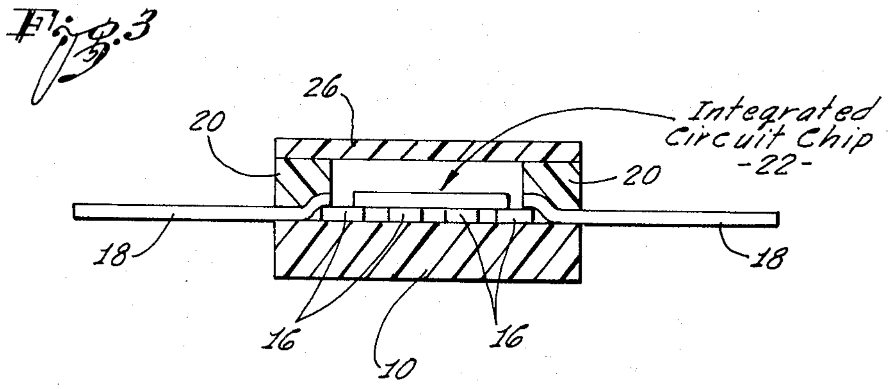
FIG. 3 is a cross-section of the device showing an integrated circuit chip within an hermetically sealed enclosure, and supported by an adhesive-type electric circuit, in accordance with the invention.

The microcircuit package illustrated in FIGS. 1–3 comprises a flat dielectric substrate 10 which may be formed, for example, of any appropriate substrate material such as alumina or beryllia ceramics, polymide or other polymers, glazed ceramics, glass ceramics, glass, glazed metals, or the like. In accordance with the invention, electrical conductors designated 16 are silk screened or otherwise formed on a surface of the base 10. The conductors 16 are formed of conductive adhesive which may take the form of epoxy to which a quantity of silver, graphite, or other conductive particles has been added.

Conductive epoxies, and others, are known to the art, and are commercially available. The conductive epoxy may then be silk screened to the base 10. For example, prior to screening, the epoxy and catalyst are mixed together, in a manner known to the art, to provide a liquid of a desired viscosity. The liquid has minimal wetting and clogging properties, so that it may be screened conveniently onto the surface of the base, and lines of a definition of 500 microns can be achieved with graphite, for example, since graphite particles as fine as 500 A. are available.

Elongated electrical terminal leads 18 are disposed over the base 10, as best shown in FIG. 1, in electrical contact with the respective adhesive electrical doncutors 16. The terminal leads 18 may initially take the form of a lead frame or comb, as shown in FIG. 1, in which the leads themselves form the teeth of the comb and are held in position by the common end of the comb, the common end being sheared off after the unit has been assembled and after the leads become rigidly supported on the base.

The leads 18 extend beyond the edges of the substrate 10, as shown, and in the preliminary stage are pressed into electrical contact with the corresponding conductors 16. The leads 18 may be formed of any suitable electrically conducting material. However, the material should have a coefficient of thermal expansion compatible with that of the substrate 10. Suitable materials for the purpose are, for example, nickel, nickel-iron (Kovar), copper clad iron-nickel, and the like.

A rectangular shaped frame member 20 may then be placed over the assembly, and it may be composed of a glass ceramic, or any other appropriate material. An integrated circuit chip 22 is then placed within the frame 20, as shown in FIG. 3, and the assembly is cured. During the curing process, the ring 20 fuses with the base 10 to form the structure of FIG. 2, and the adhesive electrical conductors 16 and the corresponding contacts on the integrated circuit chip 22 become adhesively attached so that the chip is electrically connected to the terminal leads 18, and it is also held firmly in place on the substrate 10.

An appropriate cover or lid 26 is provided, and which is sealed to the upper edge of the frame 20, so as to form an hermetic enclosure for the integrated circuit chip.

It will be appreciated, therefore, that the actual integrated circuit chip 22 is mounted in the package of the invention merely by placing it over the adhesive circuit elements 16; and that no delicate manual operations are required, as is the case with the prior art units. Therefore, units constructed in accordance with the present invention are simple and easy to produce, are susceptible to automated techniques, and may be manufactured and sold at a fraction of the cost of the prior art units of the same general type.

Figure 4:
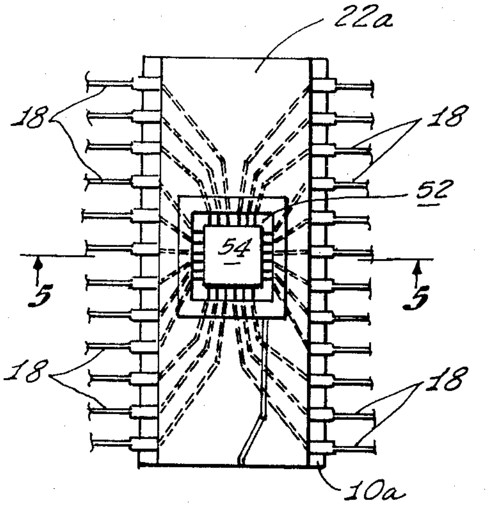
FIG. 4 is a top plan view of a typical microcircuit package.
Figure 5:
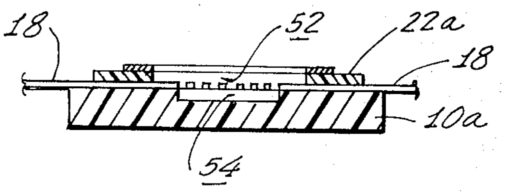
FIG. 5 is a cross-section of the package of FIG. 4 taken along the line 5—5.
Figure 6:
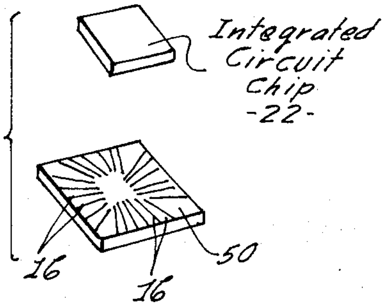
FIG. 6 is a perspective of an integrated circuit chip and mounting member in accordance with a second embodiment of the invention.

In the embodiment of FIGS. 4–6, the integrated circuit chip 22 is mounted in the package of FIG. 1, by first providing an insulating substrate 50. The adhesive leads 16 are silk-screened onto the substrate 50 by any suitable means, and the chip 22 is mounted on the substrate with its contacts adhesively attached to the respective leads, and in electrical contact therewith.

Figure 7:
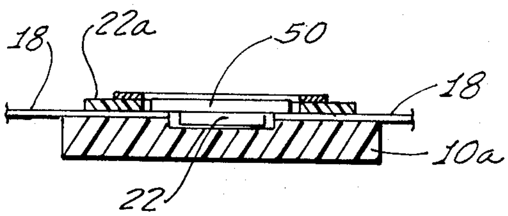
FIG. 7 is a cross-section, like FIG. 5, but with the integrated circuit chip in place in the package.

The substrate and chip are then placed into the well 52 in the frame 22a of the package of FIGS. 4 and 5, as shown in FIG. 7, with the chip extending into the well 54 in the substrate 10a; and with the substrate 50 positioned in the well 52 so that its adhesive conductors provide electrical contact to the terminals 18. The adhesive conductors then serve, not only to hold the chip 22 on the substrate 50, but also to hold the substrate 50 in the well 52.

As mentioned above, although particular embodiments of the invention have been shown and described, modifications may be made since the adhesive circuit elements may be incorporated into a variety of different types of packages. The following claims are intended to cover all modifications of the invention which fall within the spirit and scope of the invention.

What is claimed is:

1. A microcircuit package comprising a flat dielectric substrate, an integrated circuit chip mounted on said substrate; a plurality of elongated electrical terminal leads mounted on said substrate along at least one edge thereof and extending outwardly from said edge;

and a plurality of resinous adhesive electrical conductors formed on said substrate under said chip and under respective ones of said terminal leads and in bonded electrical contact with corresponding electrical contacts of said chip and extending across said substrate into bonded electrical contact with said respective ones of said terminal leads, said resinous adhesive electrical conductors amd being the sub-attachment of said chip and said terminal leads to said substrate.

2. The package defined in claim 1, in which said resinous adhesive electrical conductors are formed of an adhesive epoxy having particles of electrically conductive material disposed therein.

3. The package defined in claim 1, and which includes a base plate, and in which said substrate and said chip are received in a well in said base plate.

* * * * *